United States Patent
Yokoyama (10) Patent No.: US 10,084,431 B2
(45) Date of Patent: Sep. 25, 2018

(54) LADDER FILTER

(71) Applicant: Murata Manufacturing Co., Ltd., Nagaokakyo-shi, Kyoto-fu (JP)

(72) Inventor: Jin Yokoyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 153 days.

(21) Appl. No.: 15/378,289

(22) Filed: Dec. 14, 2016

(65) Prior Publication Data

US 2017/0093372 A1   Mar. 30, 2017

Related U.S. Application Data

(63) Continuation of application No. PCT/JP2015/062529, filed on Apr. 24, 2015.

(30) Foreign Application Priority Data

Jun. 27, 2014  (JP) ................................. 2014-132654

(51) Int. Cl.
*H03H 9/64* (2006.01)
*H03H 9/72* (2006.01)
*H03H 9/25* (2006.01)

(52) U.S. Cl.
CPC ............ *H03H 9/6483* (2013.01); *H03H 9/25* (2013.01); *H03H 9/64* (2013.01); *H03H 9/6423* (2013.01); *H03H 9/6489* (2013.01); *H03H 9/725* (2013.01)

(58) Field of Classification Search
CPC ...... H03H 9/145; H03H 9/14502; H03H 9/25; H03H 9/64; H03H 9/6423; H03H 9/6426; H03H 9/6483; H03H 9/6489
(Continued)

(56) References Cited

U.S. PATENT DOCUMENTS 6,208,223 B1 *   3/2001   Shimamura .......... H03H 9/6483
                                                              310/313 B
6,292,071 B1      9/2001   Taniguchi
(Continued)

FOREIGN PATENT DOCUMENTS

CN     1259797 A    7/2000
CN   102077465 A    5/2011
(Continued)

OTHER PUBLICATIONS

English language machine translation of JP 06-061783, published Mar. 4, 1994, 3 pages.*
(Continued)

*Primary Examiner* — Barbara Summons
(74) *Attorney, Agent, or Firm* — Keating & Bennett, LLP (57) ABSTRACT

A ladder filter includes a series arm resonator and parallel arm resonators including a first parallel arm resonator defining a pass band together with the series arm resonator, and a second parallel arm resonator. Each of dimensions, in an overlap width direction, of gap regions between the overlap width region and first and second busbars in the second parallel arm resonator is larger than a dimension, in the overlap width direction, of a gap region in the first parallel arm resonator. A resonant frequency of the second parallel arm resonator is in a frequency range of not lower than a resonant frequency of the series arm resonator.

15 Claims, 5 Drawing Sheets

(58) Field of Classification Search
USPC .......... 333/133, 193–196; 310/313 B, 313 D
See application file for complete search history.

(56) References Cited

U.S. PATENT DOCUMENTS

| | | | |
|---|---|---|---|
| 6,570,470 B2 * | 5/2003 | Maehara | H03H 9/6483 |
| | | | 310/313 B |
| 2003/0227358 A1 * | 12/2003 | Inose | H03H 9/6423 |
| | | | 333/193 |
| 2005/0025324 A1 | 2/2005 | Takata | |
| 2011/0068655 A1 | 3/2011 | Solal et al. | |
| 2011/0090026 A1 | 4/2011 | Nakahashi et al. | |

FOREIGN PATENT DOCUMENTS

| | | | | |
|---|---|---|---|---|
| JP | 06-061783 | * | 3/1994 | |
| JP | 2000-13184 A | | 1/2000 | |
| JP | 2002-232264 A | | 8/2002 | |
| JP | 2004-015397 | * | 1/2004 | .......... H03H 9/6423 |
| JP | 2005-45475 A | | 2/2005 | |
| JP | 2005-295202 A | | 10/2005 | |
| JP | 2011-101350 A | | 5/2011 | |
| JP | 2014-068123 | * | 4/2014 | |
| KR | 10-2000-0047665 A | | 7/2000 | |

OTHER PUBLICATIONS

Official Communication issued in corresponding International Application PCT/JP2015/062529, dated Jun. 2, 2015.

* cited by examiner

LADDER FILTER

CROSS REFERENCE TO RELATED APPLICATIONS

This application claims the benefit of priority to Japanese Patent Application No. 2014-132654 filed on Jun. 27, 2014 and is a Continuation Application of PCT Application No. PCT/JP2015/062529 filed on Apr. 24, 2015. The entire contents of each application are hereby incorporated herein by reference.

BACKGROUND OF THE INVENTION

1. Field of the Invention

The present invention relates to a ladder filter including a series arm resonator and a parallel arm resonator each including an elastic wave resonator.

2. Description of the Related Art

Hitherto, a ladder filter has been used as an RF-stage bandpass filter of a cellular phone or the like. The ladder filter includes a plurality of series arm resonators and a plurality of parallel arm resonators. An elastic wave resonator is generally used as each of the series arm resonators and the parallel arm resonators.

Japanese Unexamined Patent Application Publication No. 2011-101350 discloses an elastic wave resonator utilizing a so-called piston mode. A large-width portion or the like is provided at each end of an interdigital transducer electrode to form a low acoustic velocity region. In an overlap width region, the low acoustic velocity region is provided at each side of a central region of the interdigital transducer electrode. A region between the overlap width region and a busbar is defined as a gap region that is a high acoustic velocity region.

In the ladder filter, a pass band is formed by utilizing the impedance characteristics of the series arm resonators and the parallel arm resonators. However, only by utilizing the resonant frequencies and the anti-resonant frequencies of the series arm resonators and the parallel arm resonators, it is difficult to obtain sufficient out-of-band attenuation characteristics.

Meanwhile, in the elastic wave resonator that is disclosed in Japanese Unexamined Patent Application Publication No. 2011-101350 and utilizes the piston mode, the low acoustic velocity region is provided, and the gap region, which is the high acoustic velocity region, is provided outside the low acoustic velocity region. Accordingly, a transverse mode ripple is suppressed. However, in such a structure, since the low acoustic velocity region has to be provided, there is a problem that the area of each elastic wave resonator increases.

SUMMARY OF THE INVENTION

Preferred embodiments of the present invention provide a ladder filter that is able to reduce influence of a transverse mode ripple without increasing the size of each resonator.

A ladder filter according to a preferred embodiment of the present invention includes a series arm resonator including an elastic wave resonator, and a plurality of parallel arm resonators each including an elastic wave resonator, wherein the plurality of parallel arm resonators include a first parallel arm resonator defining a pass band together with the series arm resonator, and a second parallel arm resonator; each elastic wave resonator includes first and second busbars, and a plurality of first electrode fingers and a plurality of second electrode fingers connected at ends thereof to the first and second busbars, respectively, and when a portion in which the plurality of first electrode fingers and the plurality of second electrode fingers overlap each other viewed in an elastic wave propagation direction is defined as an overlap width region, and a region between the overlap width region and each of the first and second busbars is defined as a gap region, a dimension, in an overlap width direction, of the gap region in the second parallel arm resonator is larger than a dimension, in the overlap width direction, of the gap region in the first parallel arm resonator, and a resonant frequency of the second parallel arm resonator is in a frequency range of not lower than a resonant frequency of the series arm resonator.

In a specific aspect of a ladder filter according to a preferred embodiment of the present invention, the resonant frequency of the second parallel arm resonator is in a frequency range of not lower than an anti-resonant frequency of the series arm resonator.

In another specific aspect of a ladder filter according to a preferred embodiment of the present invention, $L1 < 7 \times \lambda$ is satisfied when a wavelength determined based on an electrode finger pitch of the second parallel arm resonator is denoted by $\lambda$ and a dimension of the overlap width region along the overlap width direction is denoted by $L1$.

In still another specific aspect of a ladder filter according to a preferred embodiment of the present invention, $L1 < 4 \times \lambda$ is satisfied when the wavelength determined based on the electrode finger pitch of the second parallel arm resonator is denoted by $\lambda$ and the dimension of the overlap width region along the overlap width direction is denoted by $L1$.

According to various preferred embodiments of the present invention, a sufficient high acoustic velocity region is provided in the second parallel arm resonator. Thus, it is possible to obtain favorable resonance characteristics without providing a low acoustic velocity region. In addition, the resonant frequency of the second parallel arm resonator is increased so as to be equal to or higher than the resonant frequency of the series arm resonator. Thus, it is possible to improve out-of-band attenuation characteristics. Moreover, it is possible to cause a transverse mode ripple to be spaced away from the resonant frequency of the series arm resonator. Accordingly, it is possible to improve the out-of-band attenuation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

Figure 4:
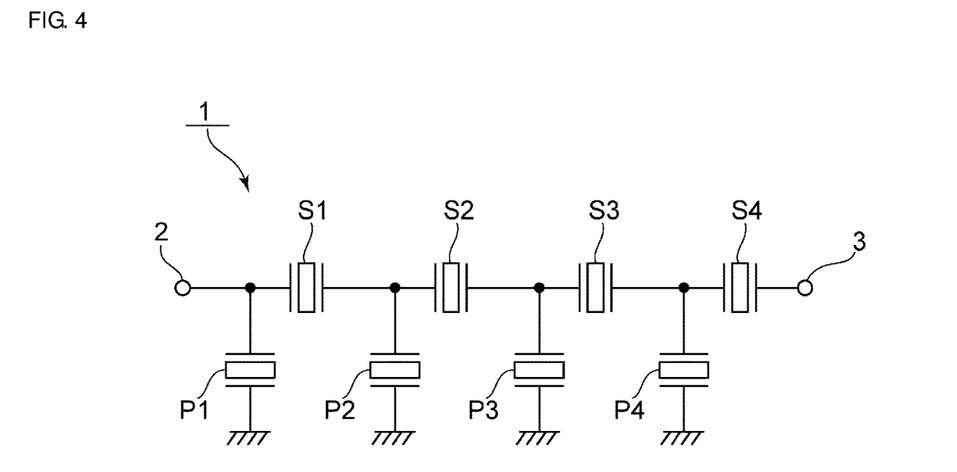
FIG. 4 is a circuit diagram of a ladder filter according to the first preferred embodiment of the present invention.

FIG. 4 is a circuit diagram of a ladder filter according to a first preferred embodiment of the present invention. The ladder filter 1 includes a series arm connecting an input terminal 2 and an output terminal 3. In the series arm, series arm resonators S1 to S4 are connected in series. A plurality of parallel arms are provided to connect the series arm and a ground potential. Parallel arm resonators P1 to P4 are provided on the respective parallel arms. The parallel arm resonators P1 to P3 include a first parallel arm resonator, and define a pass band together with the series arm resonators S1 to S4. The parallel arm resonator P4 corresponds to a second parallel arm resonator.

The pass band of the ladder filter is provided by utilizing the resonance characteristics of the series arm resonators S1 to S4 and the resonance characteristics of the first parallel arm resonators P1 to P3. That is, an attenuation pole located at the low frequency side of the pass band is provided by the resonant frequencies of the parallel arm resonators P1 to P3. In addition, an attenuation pole located at the high frequency side of the pass band is provided by the anti-resonant frequencies of the series arm resonators S1 to S4.

However, only when the resonance characteristics of the series arm resonators S1 to S4 and the resonance characteristics of the parallel arm resonators P1 to P3 are utilized, it is difficult to obtain favorable out-of-band attenuation characteristics. In the present preferred embodiment, since the second parallel arm resonator P4 is provided, it is possible to improve out-of-band attenuation characteristics as described in detail later.

Each of the series arm resonators S1 to S4 and the parallel arm resonators P1 to P4 includes a surface acoustic wave resonator.

Figure 1A:
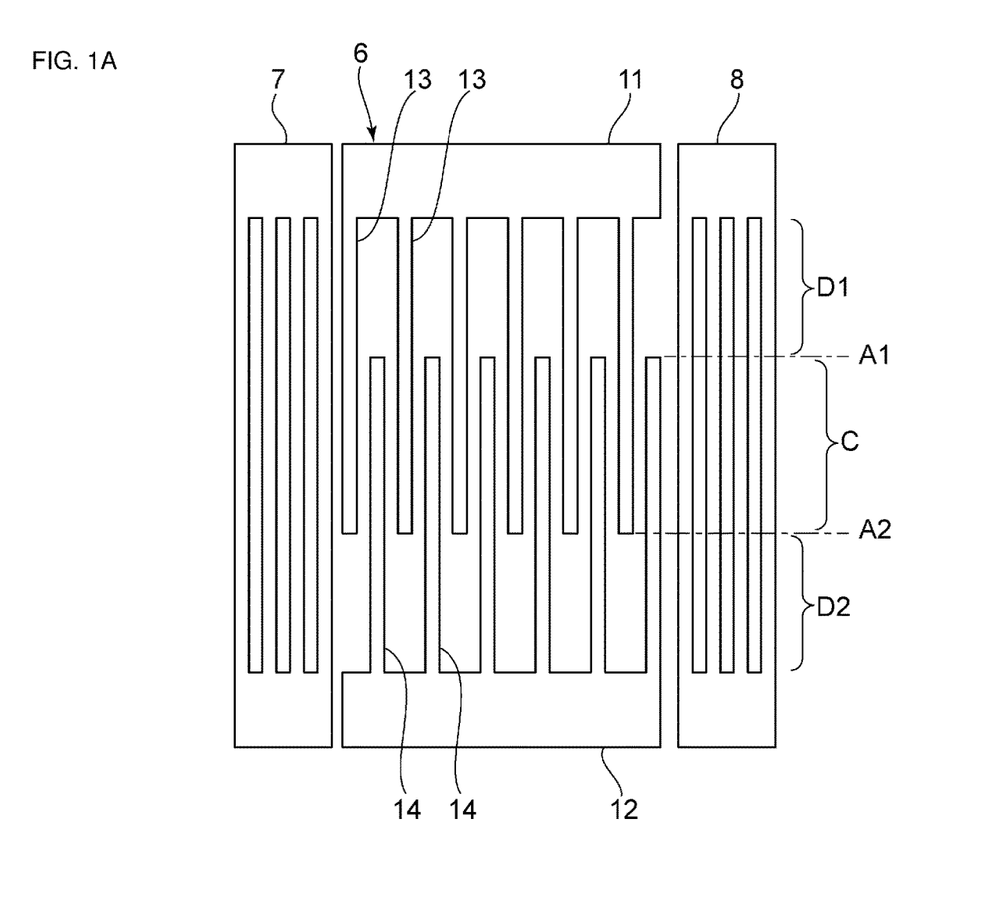
FIG. 1A is a plan view showing an electrode structure of a second parallel arm resonator included in a first preferred embodiment of the present invention.
Figure 1B:
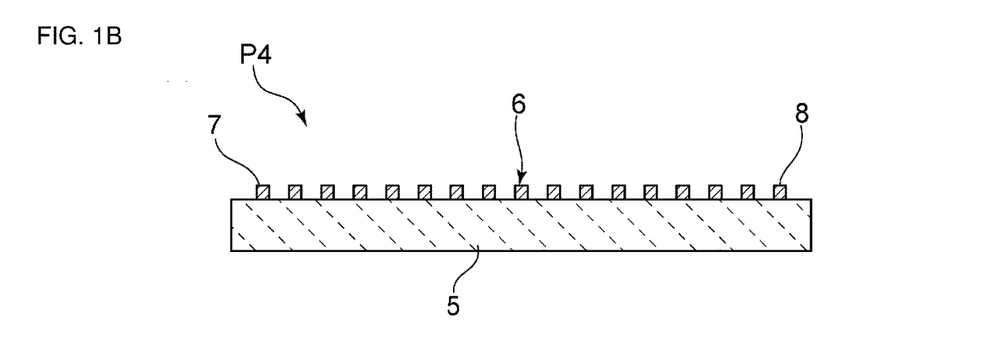
FIG. 1B is a schematic front cross-sectional view of the second parallel arm resonator.

FIG. 1A is a plan view showing an electrode structure of the second parallel arm resonator P4, and FIG. 1B is a schematic front cross-sectional view of the second parallel arm resonator P4.

The second parallel arm resonator P4 includes a piezoelectric substrate 5. The piezoelectric substrate 5 includes a piezoelectric monocrystal such as LiTaO$_3$ or LiNbO$_3$. However, piezoelectric ceramics may be used instead of the piezoelectric monocrystal.

The electrode structure shown in FIG. 1A is provided on the piezoelectric substrate 5. That is, an interdigital transducer electrode 6 and reflectors 7 and 8 located at both sides of the interdigital transducer electrode 6 in an elastic wave propagation direction are provided thereon.

The electrode structure includes an appropriate metal such as Al, Cu, W, Pt, and Au, or an alloy. The electrode structures may be defined by a multilayer metal film obtained by laminating a plurality of metal films.

The reflectors 7 and 8 are each a grating reflector preferably formed by short-circuiting both ends of a plurality of electrode fingers.

The interdigital transducer electrode 6 includes a first busbar 11 and a second busbar 12. The first busbar 11 and the second busbar 12 are extended in the elastic wave propagation direction. One end of each of a plurality of first electrode fingers 13 is connected to the first busbar 11. One end of each of a plurality of second electrode fingers 14 is connected to the second busbar 12. The plurality of first electrode fingers 13 and the plurality of second electrode fingers 14 extend in a direction perpendicular or substantially perpendicular to the elastic wave propagation direction. The plurality of first electrode fingers 13 and the plurality of second electrode fingers 14 are interleaved with each other. A portion in which the first electrode fingers 13 and the second electrode fingers 14 overlap each other when viewed from the elastic wave propagation direction is defined as an overlap width region. In addition, the direction in which the electrode fingers 13 and 14 extend is defined as an overlap width direction. In FIG. 1A, when the dimension of each electrode finger in the elastic wave propagation direction is defined as the width of the electrode finger, the width of each of the plurality of first electrode fingers 13 and the plurality of second electrode fingers 14 is made uniform. When the dimension of each electrode finger in a normal direction of the surface of the piezoelectric substrate on which the interdigital transducer electrode 6 is provided is defined as the thickness of the electrode finger, the thickness of each of the plurality of first electrode fingers 13 and the plurality of second electrode fingers 14 is made uniform.

In the interdigital transducer electrode 6, a rectangular or substantially rectangular region sandwiched between an alternate long and short dashed line A1 and an alternate long and short dashed line A2 in FIG. 1A is an overlap width region C. Gap regions D1 and D2 are provided outside the overlap width region C in the overlap width direction. The gap region D1 is a rectangular or substantially rectangular region between the first busbar 11 and the overlap width region C. The gap region D2 is a rectangular or substantially rectangular region between the second busbar 12 and the overlap width region C. In the gap region D1, only the first electrode fingers 13 are located along the elastic wave propagation direction. Therefore, the gap region D1 is a high acoustic velocity region as compared to the overlap width region C. Similarly, since only the plurality of second electrode fingers 14 are located in the gap region D2, the gap region D2 is a relatively high acoustic velocity region. The shape of the overlap width region C is preferably a rectangular or substantially rectangular shape, for size reduction. However, the shape of the overlap width region C may not necessarily be a rectangular or substantially rectangular shape, and the length, in the overlap width direction, of each first electrode finger 13 or each second electrode finger 14 in the overlap width region C may be changed. In this case, the arithmetic mean of the lengths of portions where the first and second electrode fingers overlap may be used as the dimension in the overlap width direction.

Figure 3:
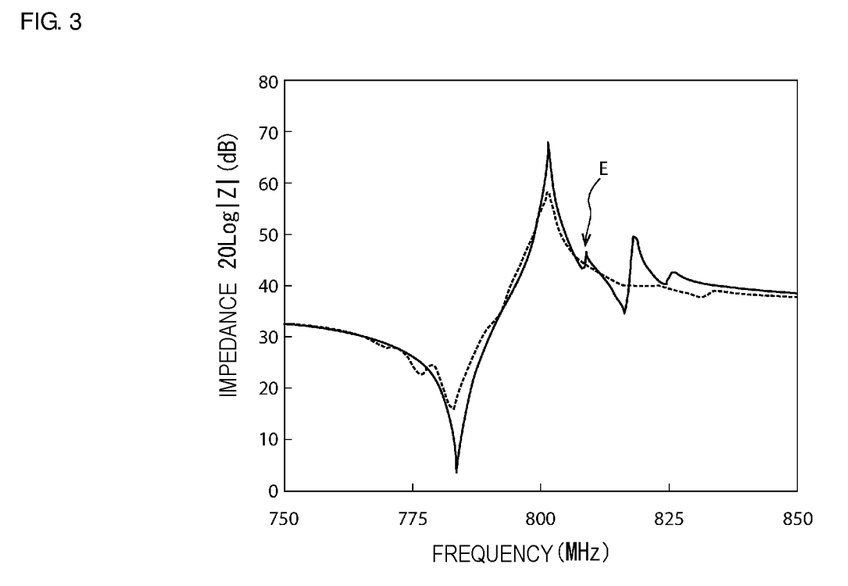
FIG. 3 is a diagram wherein a solid line shows the resonance characteristics of the second parallel arm resonator and a broken line shows the resonance characteristics of an elastic wave resonator which is prepared for comparison and in which a gap region is not enlarged.

FIG. 3 is a diagram showing the resonance characteristics of the second parallel arm resonator P4 and the resonance characteristics of an elastic wave resonator of a comparative example. A solid line shows the resonance characteristics of the second parallel arm resonator P4, and a broken line shows the resonance characteristics of the elastic wave resonator of the comparative example.

Figure 2:
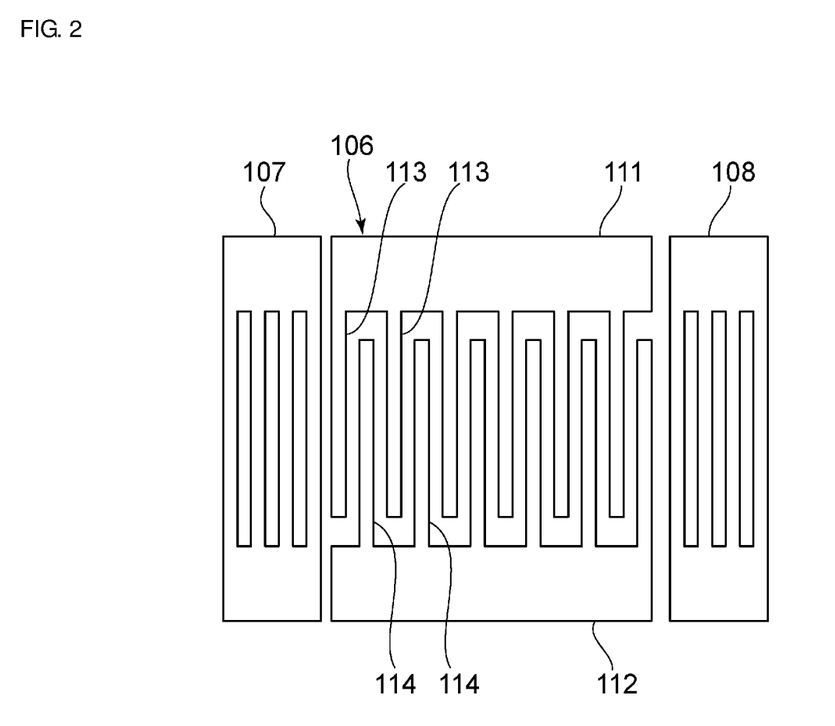
FIG. 2 is a plan view showing an electrode structure of a comparative example.

FIG. 2 shows an electrode structure of the comparative example in plan view. As shown in FIG. 2, in the elastic wave resonator of the comparative example, an interdigital transducer electrode 106 includes first and second busbars 111 and 112, a plurality of first electrode fingers 113, and a plurality of second electrode fingers 114. As is clear from comparison between FIG. 1A and FIG. 2, the dimension, in the overlap width direction, of a gap region is shortened and is made much shorter than the dimension, in the overlap width direction, of an overlap width region, in the elastic wave resonator of the comparative example. On the other hand, in the preferred embodiment shown in FIG. 1A, the dimension, in the overlap width direction, of each of the gap regions D1 and D2 is equal or substantially equal to the dimension, in the overlap width direction, of the overlap width region C, which is a high acoustic velocity layer. Accordingly, owing to the symmetry, it is possible to increase energy to confine a main mode by the high acoustic velocity layer. Therefore, due to the energy being confined, it is possible to ensure favorable resonator characteristics. The dimension, in the overlap width direction, of the gap region D1 may be different from the dimension, in the overlap width direction, of the gap region D2.

Since the dimensions, in the overlap width direction, of the gap regions D1 and D2 are made large as described above, favorable resonance characteristics are obtained with the second parallel arm resonator P4 as shown in FIG. 3, even without providing a low acoustic velocity region. That is, it is possible to cause a top-to-valley ratio, which is the ratio of the impedance at the anti-resonant frequency relative to the impedance at the resonant frequency, to be high as compared to the resonance characteristics of the comparative example shown by the broken line.

In the resonance characteristics shown by the solid line in FIG. 3, a transverse mode ripple appears as shown by an arrow E, but the frequency position of the transverse mode ripple is higher than the anti-resonant frequency. Therefore, it is determined that by selecting the position of the resonant frequency of the second parallel arm resonator P4, it is possible to form filter characteristics in which influence of the transverse mode ripple E is unlikely to occur. In addition, since a low acoustic velocity region including a large-width portion does not have to be provided, size increase of the second parallel arm resonator P4 is also unlikely to occur. Since a large-width portion is not provided, it is possible to widen a gap between a large-width portion of each electrode finger and the adjacent electrode finger having a different potential, so that it is possible to increase the withstand voltage of the interdigital transducer electrode.

In the ladder filter 1 of the present preferred embodiment, the second parallel arm resonator P4 preferably has a structure as described above, and the resonant frequency of the second parallel arm resonator P4 is higher than the resonant frequencies of the series arm resonators S1 to S4. Accordingly, the out-of-band attenuation characteristics of the ladder filter are improved. This will be described with reference to FIGS. 5 to 7.

Figure 5:
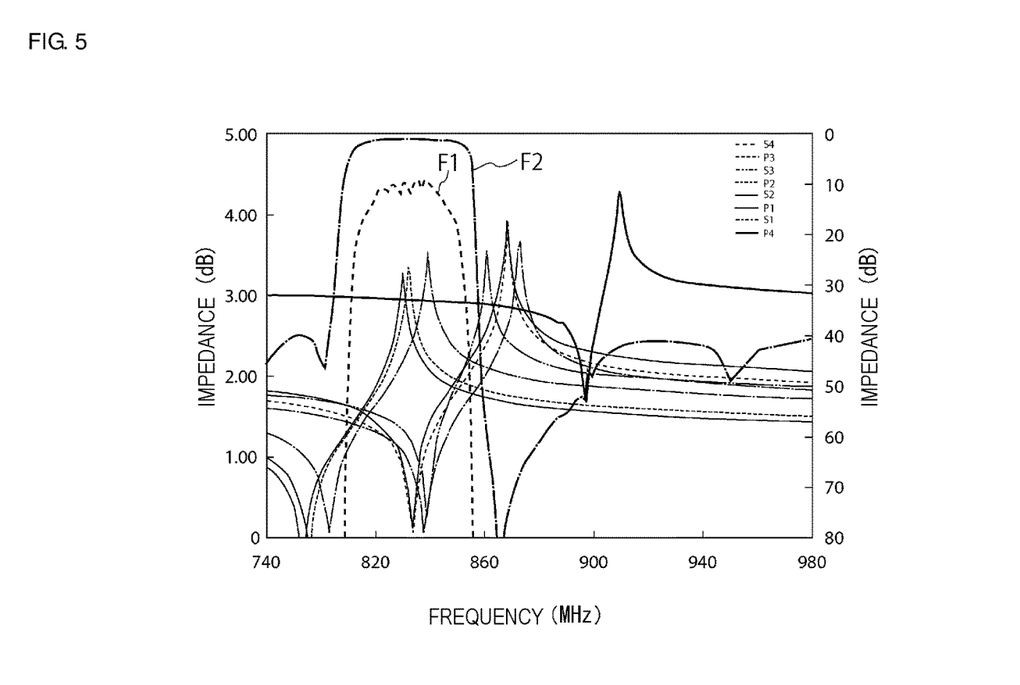
FIG. 5 is a diagram showing the filter characteristics of the ladder filter and the resonance characteristics of first and second parallel arm resonators and series arm resonators according to the first preferred embodiment of the present invention.

In FIG. 5, the filter characteristics of the ladder filter of the preferred embodiment described above are shown by a broken line F1 and an alternate long and short dashed line F2. The broken line F1 shows an enlarged diagram of the filter characteristics shown by the alternate long and short dashed line F2.

The resonance characteristics of the first parallel arm resonators P1 to P3, the first to fourth series arm resonators S1 to S4, and the second parallel arm resonator P4 are also shown.

In the present preferred embodiment, the attenuation pole at the low frequency side of the pass band is provided by the resonant frequencies of the first parallel arm resonators P1 to P3. In addition, the attenuation pole is provided at the high frequency side of the pass band by the anti-resonant frequencies of the series arm resonators S1 to S4. That is, the pass band is provided by the first parallel arm resonators P1 to P3 and the series arm resonators S1 to S4. On the other hand, the resonant frequency of the second parallel arm resonator P4 is in a frequency range of not lower than the resonant frequencies of the series arm resonators S1 to S4, further not lower than the anti-resonant frequencies thereof. Therefore, in the ladder filter 1, an out-of-band attenuation at the higher frequency side than the attenuation pole at the high frequency side of the pass band is enlarged. In addition, in the second parallel arm resonator P4, the transverse mode ripple is present at a frequency position higher than the anti-resonant frequency, and thus no transverse mode ripple is located within the pass band of the ladder filter 1. Therefore, deterioration of the filter characteristics of the pass band is also unlikely to occur.

Therefore, since the ladder filter 1 includes the second parallel arm resonator P4, it is possible to enlarge the out-of-band attenuation, so that it is determined that favorable filter characteristics are obtained.

More preferably, the resonant frequency of the second parallel arm resonator P4 is present in a frequency range of not lower than the anti-resonant frequencies of the series arm resonators S1 to S4. Therefore, it is possible to more effectively reduce the influence of the transverse mode ripple.

Figure 6:
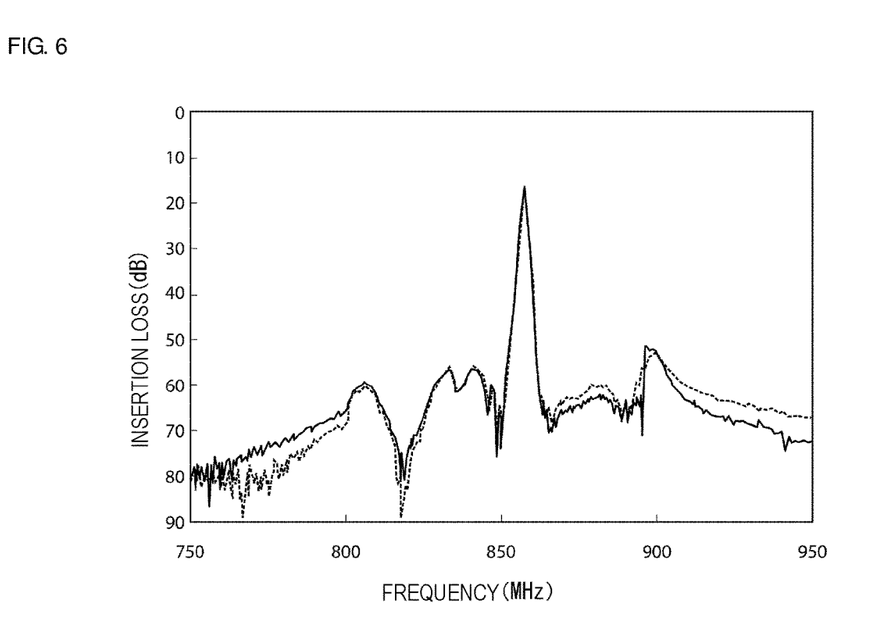
FIG. 6 is a diagram showing the filter characteristics of the ladder filter of the first preferred embodiment of the present invention and the filter characteristics of a ladder filter of a second comparative example.

FIG. 6 is a diagram showing the filter characteristics of the ladder filter of the above preferred embodiment and the filter characteristics of a ladder filter of a second comparative example configured in a similar manner except that the second parallel arm resonator P4 is not provided, for comparison. A solid line shows the results of the above preferred embodiment, and a broken line shows the filter characteristics of the ladder filter of the second comparative example.

As is clear from FIG. 6, it is determined that with the ladder filter of the present preferred embodiment, it is possible to enlarge the out-of-band attenuation as compared to the ladder filter of the second comparative example, which does not include the second parallel arm resonator.

Figure 7:
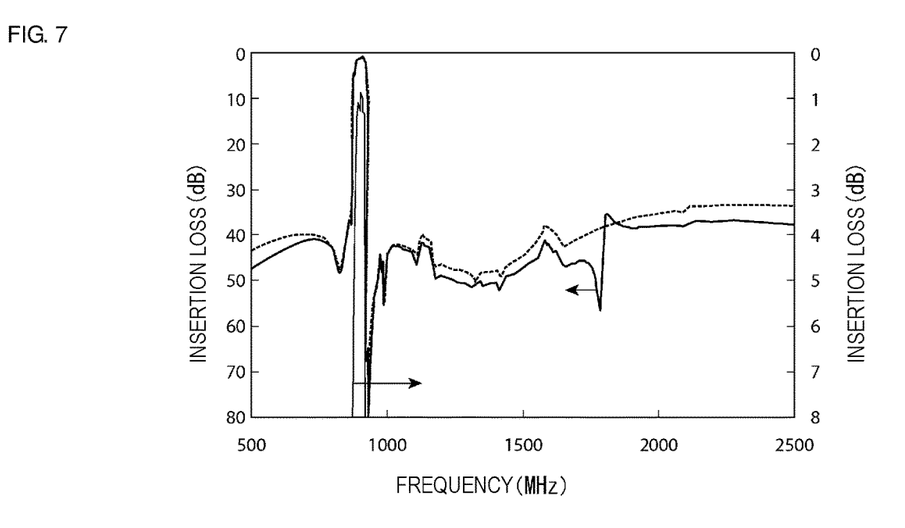
FIG. 7 is a diagram showing transmission characteristics in a duplexer including the ladder filter of the first preferred embodiment of the present invention as a transmission filter and transmission characteristics of a third comparative example.

FIG. 7 is a diagram showing the transmission characteristics in a duplexer including the ladder filter 1 of the above preferred embodiment as a transmission filter. In FIG. 7, a solid line shows the results of the present preferred embodiment, and a broken line shows the results of a third comparative example. The third comparative example is configured in a similar manner as the above preferred embodiment except that the second parallel arm resonator P4 is not provided. As is clear from FIG. 7, it is determined that according to the present preferred embodiment, it is possible to enlarge the out-of-band attenuation over a wide frequency range as compared to the third comparative example.

As is clear also from FIGS. 6 and 7, it is determined that with the ladder filter 1, it is possible to considerably improve the out-of-band attenuation characteristics, since the second parallel arm resonator P4 is provided and the resonant frequency of the second parallel arm resonator is increased so as to be equal to or higher than the resonant frequency of each of the series arm resonators S1 to S4.

In the second parallel arm resonator P4, the gap regions D1 and D2 are desirably sufficiently large, but, when the dimension, in the overlap width direction, of the overlap width region is denoted by L1, L1<7×λ is preferably satisfied, and L1<4×λ is more preferably satisfied. This will be described next. λ is a wavelength determined based on the electrode finger pitch of the elastic wave resonator.

Figure 8:
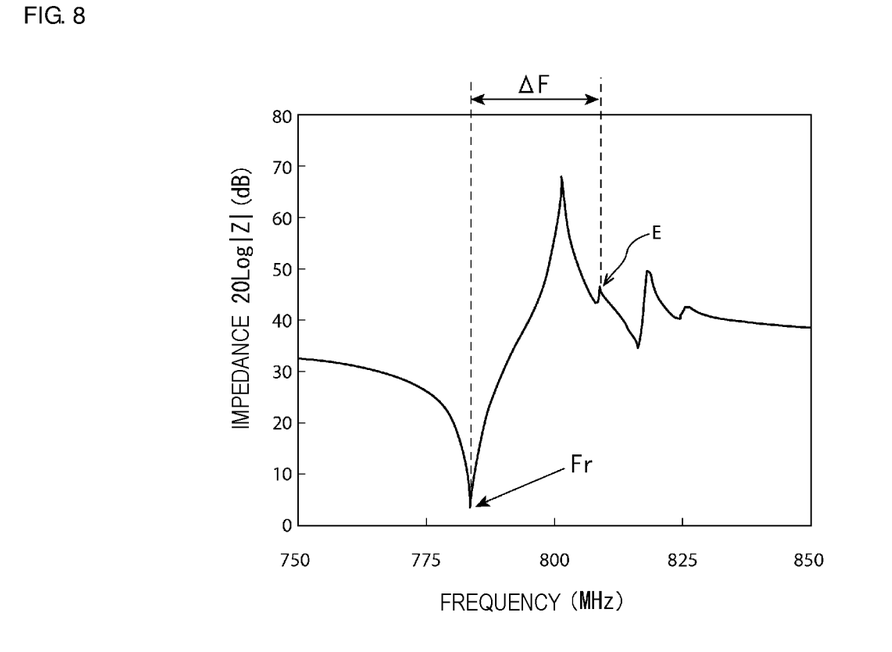
FIG. 8 is a diagram showing the resonance characteristics of the elastic wave resonator for explaining a frequency difference ΔF between a transverse mode ripple and a resonant frequency Fr.

FIG. 8 is a diagram of resonance characteristics for explaining a difference ΔF between a resonant frequency Fr and the frequency position of the transverse mode ripple E in the second parallel arm resonator P4. That is, the frequency difference ΔF is a measure indicating how far the transverse mode ripple E is away from the resonant frequency Fr in frequency.

Figure 9:
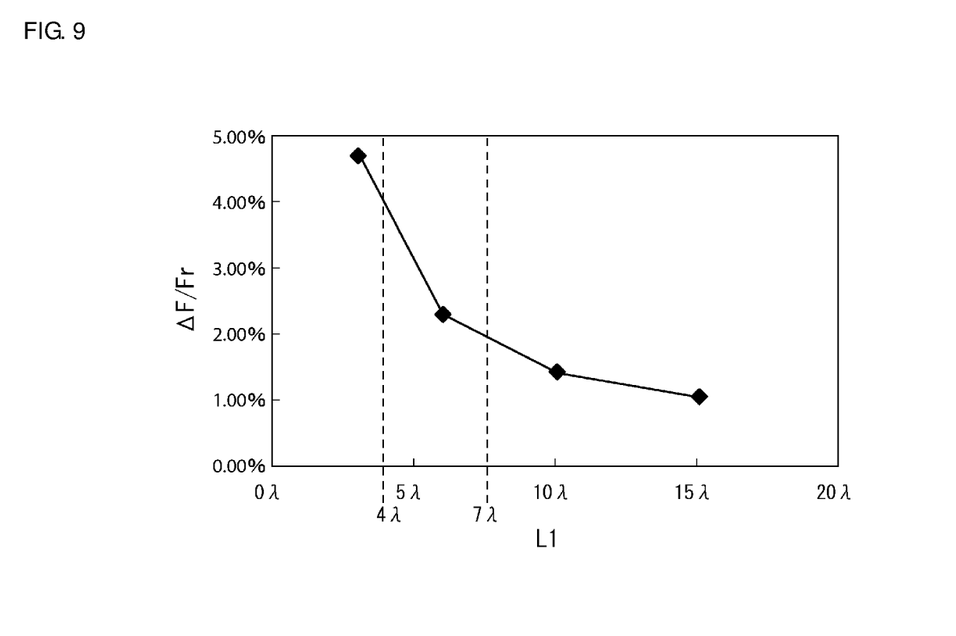
FIG. 9 is a diagram showing a relationship between a dimension L1 of an overlap width region and ΔF/Fr.

FIG. 9 is a diagram showing change of ΔF/Fr when the dimension L1, in the overlap width direction, of the overlap width region is changed. As is clear from FIG. 9, when L1 is equal to or less than 7λ, it is possible to make ΔF/Fr equal to or higher than about 2%, for example. That is, it is possible to effectively cause the transverse mode ripple to be spaced away from the resonant frequency. Therefore, it is possible to obtain out-of-band attenuation characteristics that are not influenced by ripple, over a wide frequency range. In addition, when L1 is equal to or less than 4λ, it is possible to make ΔF/Fr equal to or higher than about 4.0%, for example, and it is possible to cause the transverse mode ripple to be farther away therefrom. Therefore, it is possible to obtain favorable attenuation characteristics that are not influenced by ripple, over a wider frequency range.

In ladder filters of various preferred embodiments of the present invention, the number of stages of the series arm resonators and the first parallel arm resonators is not particularly limited. In addition, a plurality of second parallel arm resonators may be provided. Furthermore, in the case where a plurality of second parallel arm resonators are provided, it is not necessarily necessary to make all the resonance characteristics of the second parallel arm resonators equal or substantially equal to each other. Moreover, the position on the parallel arm at which the second parallel arm resonator is provided may be changed from the position in the above preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter comprising:
    a series arm resonator including an elastic wave resonator; and
    a plurality of parallel arm resonators each including an elastic wave resonator; wherein
    the plurality of parallel arm resonators include a first parallel arm resonator defining a pass band together with the series arm resonator, and a second parallel arm resonator;
    each of the elastic wave resonators includes first and second busbars, and a plurality of first electrode fingers and a plurality of second electrode fingers connected at ends thereof to the first and second busbars, respectively, and when a portion in which the plurality of first electrode fingers and the plurality of second electrode fingers overlap each other when viewed in an elastic wave propagation direction is defined as an overlap width region, and a region between the overlap width region and each of the first and second busbars is defined as a gap region, a dimension, in an overlap width direction, of the gap region in the second parallel arm resonator is larger than a dimension, in the overlap width direction, of the gap region in the first parallel arm resonator; and
    a resonant frequency of the second parallel arm resonator is in a frequency range of not lower than a resonant frequency of the series arm resonator.

2. The ladder filter according to claim 1, wherein the resonant frequency of the second parallel arm resonator is in a frequency range of not lower than an anti-resonant frequency of the series arm resonator.

3. The ladder filter according to claim 1, wherein L1<7×λ is satisfied when a wavelength determined based on an electrode finger pitch of the second parallel arm resonator is denoted by λ and a dimension of the overlap width region along the overlap width direction is denoted by L1.

4. The ladder filter according to claim 3, wherein L1<4×λ is satisfied when the wavelength determined based on the electrode finger pitch of the second parallel arm resonator is denoted by λ and the dimension of the overlap width region along the overlap width direction is denoted by L1.

5. The ladder filter according to claim 1, wherein the plurality of parallel arm resonators connect the series arm resonator and a ground.

6. The ladder filter according to claim 1, wherein the series arm resonator includes a plurality of series arm resonators.

7. The ladder filter according to claim 6, wherein the elastic wave resonators are surface acoustic wave resonators.

8. The ladder filter according to claim 6, wherein the resonant frequency of the second parallel arm resonator is higher than resonant frequencies of the series arm resonators.

9. The ladder filter according to claim 1, further comprising reflectors located at outer ends of the elastic wave resonators.

10. The ladder filter according to claim 1, wherein the overlap width region is rectangular or substantially rectangular.

11. The ladder filter according to claim 1, wherein an arithmetic mean of lengths of portions where the first and second electrode fingers overlap defines a dimension in the overlap width direction.

12. The ladder filter according to claim 1, wherein a transverse mode ripple is not located in the pass band.

13. The ladder filter according to claim 1, wherein a transverse mode ripple is spaced away from the resonant frequency of the second parallel arm resonator.

14. The ladder filter according to claim 1, wherein the second parallel arm resonator includes a plurality of second parallel arm resonators.

15. A duplexer comprising:
    the ladder filter according to claim 1; wherein
    the ladder filter defines a transmission filter.

* * * * *